United States Patent
Shen et al.

(10) Patent No.: US 10,333,473 B1
(45) Date of Patent: Jun. 25, 2019

(54) STABILIZING HIGH PERFORMANCE AUDIO AMPLIFIERS

(71) Applicant: SYNAPTICS INCORPORATED, San Jose, CA (US)

(72) Inventors: Dan Shen, Irvine, CA (US); Balakishan Challa, Irvine, CA (US); Lorenzo Crespi, Costa Mesa, CA (US)

(73) Assignee: SYNAPTICS INCORPORATED, San Jose, CA (US)

( * ) Notice: Subject to any disclaimer, the term of this patent is extended or adjusted under 35 U.S.C. 154(b) by 0 days.

(21) Appl. No.: 15/963,972

(22) Filed: Apr. 26, 2018

(51) Int. Cl.
 *H03F 3/183* (2006.01)
 *H03F 3/45* (2006.01)
 *H03F 1/02* (2006.01)

(52) U.S. Cl.
 CPC ........... *H03F 3/183* (2013.01); *H03F 1/0205* (2013.01); *H03F 3/45475* (2013.01); *H03F 2200/03* (2013.01); *H03F 2200/129* (2013.01); *H03F 2203/45528* (2013.01)

(58) Field of Classification Search
 CPC .... H03F 3/183; H03F 3/45475; H03F 1/0205; H03F 2200/129; H03F 2200/03; H03F 2203/45528
 See application file for complete search history.

(56) References Cited

U.S. PATENT DOCUMENTS

2005/0077958 A1\* 4/2005 Bunner .................... H03F 1/34
330/86

\* cited by examiner

*Primary Examiner* — Ping Lee
(74) *Attorney, Agent, or Firm* — Haynes and Boone, LLP

(57) ABSTRACT

Systems and methods are provided for improved stability of audio amplifiers that incorporate external speaker connectivity. In one example, a system includes an audio amplifier circuit comprising two or more amplifier stages and a stability resistor and configured to receive an audio input signal, the audio amplifier circuit configured for at least two modes of operation, a first mode having a high input transconductance and the stability resistor is coupled to an output of the audio amplifier circuit, and a second mode having a lower input transconductance and the stability resistor is decoupled from the output of the audio amplifier circuit. The system further includes an amplitude detection circuit configured to provide a signal mode detection signal, an amplifier switching circuit configured to adjust a variable input transconductance of at least one of the amplifier stages, and a load switching circuit configured to couple and decouple the stability resistor at the output of the audio amplifier circuit.

20 Claims, 4 Drawing Sheets

STABILIZING HIGH PERFORMANCE AUDIO AMPLIFIERS

TECHNICAL FIELD

The present disclosure, in accordance with one or more embodiments, relates generally to audio amplifiers and, more particularly for example, to improving signal stability within high performance audio amplifiers.

BACKGROUND

Many modern devices such as laptop computers, computer tablets, MP3 players, and smart phones provide for headphone connectivity utilizing internal headphone amplifiers. Headphone amplifiers are known to be difficult to stabilize because the load impedance can vary dramatically based on variations in headphone implementations. For example, headphone impedance can vary from being very capacitive, to very inductive, or mostly resistive depending on the headphone model or headphone manufacturer. Due to miniaturization of modern devices and limitations in thermal dissipation caused by such miniaturization, current solutions to maintain performance in current headphone amplifiers are not always practical. Thus, there is a continued need to improve stability and noise performance of amplifiers to maintain high performance in modern devices that incorporate amplifiers, such as headphone amplifiers.

SUMMARY

The present disclosure provides systems and methods that address a need in the art for improved stability of amplifiers used in modern devices, such as modern devices including audio amplifiers that incorporate external speaker connectivity. The scope of the present disclosure is defined by the claims, which are incorporated into this section by reference. A more complete understanding of the present disclosure will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Aspects of the disclosure and their advantages can be better understood with reference to the following drawings and the detailed description that follows. It should be appreciated that like reference numerals are used to identify like elements illustrated in one or more of the figures, where showings therein are for purposes of illustrating embodiments of the present disclosure and not for purposes of limiting the same. The components in the drawings are not necessarily to scale, emphasis instead being placed upon clearly illustrating the principles of the present disclosure.

DETAILED DESCRIPTION

The present disclosure describes systems and methods that address a need in the art to improve stability of an audio amplifier to maintain high performance in modern devices that incorporate external speaker functionality. In one embodiment, an audio amplifier of the present disclosure includes two or more amplification stages configured to receive an audio input signal and provide an amplified audio signal to a speaker. In some embodiments a speaker may be implemented within a headphone or other type of portable audio device. It will be appreciated that the circuitry and techniques described herein may be applicable to a variety of amplifier implementations where improved stability and low noise are desired.

Figure 1:
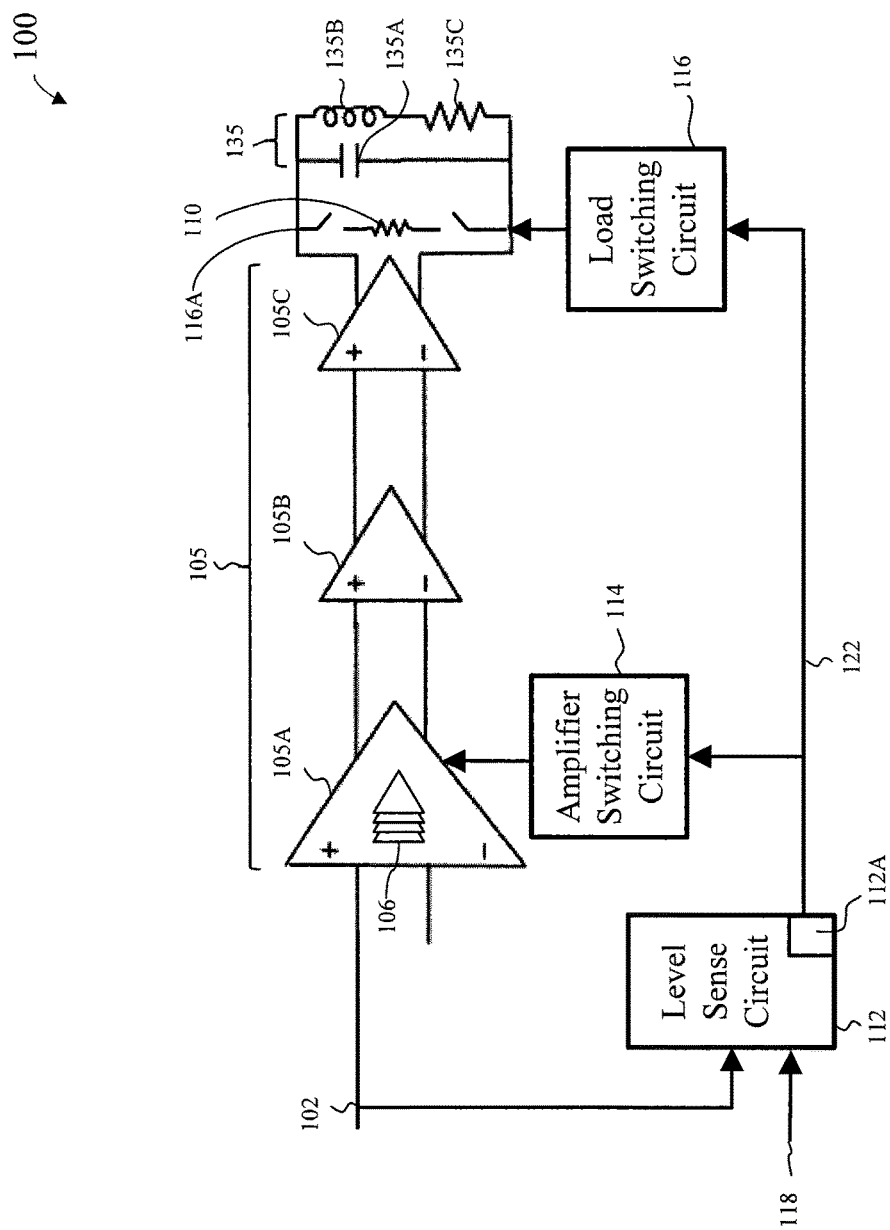
FIG. 1 illustrates an exemplary schematic diagram of a high fidelity stable audio amplifier in accordance with an embodiment of the disclosure.

FIG. 1 illustrates an exemplary schematic diagram of a high fidelity stable audio amplifier 100 in accordance with an embodiment of the disclosure. In some embodiments, high fidelity stable audio amplifier 100 of FIG. 1 forms part of an audio codec circuit. In various embodiments, high fidelity stable audio amplifier 100 includes an audio amplifier circuit 105, an amplitude detection circuit 112, an amplifier switching circuit 114, and a load switching circuit 116. High fidelity stable audio amplifier 100 receives an audio input signal 102 and processes the audio input signal 102 to provide an amplified audio output signal to drive a complex impedance speaker load 135, which may be implemented in a headphone, a mobile phone, laptop computer, tablet, audio/video system, or other similar device. In various embodiments, complex impedance speaker load 135 includes a capacitive element 135A, an inductive element 135B, and a resistive element 135C. As discussed herein, depending on type, manufacturer, and/or model, complex impedance speaker load 135 may be highly capacitive, highly inductive, and/or highly resistive. End users are most concerned with noise at small input signal settings, as noise most greatly affects user's listening enjoyment at this level. In this regard, as discussed herein, conventional audio amplifiers used in many modern devices have difficulty providing high audio performance such as low noise levels and signal stability across varying loads of complex impedance speaker load 135 particularly at small signals levels while still maintaining low power consumption.

In the illustrated embodiment, the audio amplifier circuit 105 comprises three amplifier stages, including a first stage amplifier 105A, a second stage amplifier 105B and a third stage amplifier 105C. In various embodiments, the input audio stage amplifier 105A (also referred to herein as the first amplifier stage) is a variable transconductance amplifier including circuitry 106 (e.g., plurality of transconductance stages) for selectively setting the input transconductance. In operation, components of high fidelity stable audio amplifier 100 detect an audio input signal 102 and adjust an input transconductance of the first amplifier stage 105A and a stability resistor 110 coupled to an output of audio amplifier circuit 105 based on the detection. In this regard, a dynamic audio amplifier configuration reacts to varying audio input signal 102 amplitudes to maintain amplifier stability and reduced power consumption. For example, adjusting for high input transconductance of audio amplifier circuit 105 significantly reduces noise. However, high input transconductance may affect signal stability and to reduce such affect, stability resistor 110 is coupled to the output of amplifier circuit 105. During small signal mode of operation, when noise is most noticeable by a user, high input transconductance and stability resistor 110 provide for low noise and stability. During small signal mode of operation, power consumption is reduced because current through stability resistor is low.

Additionally, when operating in a large signal mode, audio amplifier circuit 105 input transconductance may be reduced and stability resistor 110 may be decoupled from audio amplifier circuit 105. For example, while operating in large signal mode, noise is less noticeable by the user and input transconductance may be reduced. Furthermore, stability resistor 110 may be decoupled from audio amplifier 105 output in large signal mode operation because amplifier circuit 105 may be more stable, and by decoupling stability resistor 110, power consumption may be reduced. In this regard, high fidelity stable audio amplifier 100 may be implemented with any amplifier where a dynamic range requirement is higher than the total harmonic distortion plus noise (THD+N). In some embodiments, high fidelity stable audio amplifier 100 is implemented with a dynamic range specified in a range of approximately 120-130 dB, and THD+N specified in a range approximately 100-105 dB.

In one embodiment, input audio amplifier stage 105A is a programmable input transconductance amplifier with a selectively adjustable input transconductance. In some embodiments, the input transconductance may be adjusted by amplifier switching circuit 114. For example, input audio amplifier stage 105A may be adjusted by amplifier switching circuit 114 to provide a high input transconductance in a first mode of operation and a lower input transconductance in a second mode of operation. In some embodiments, a first mode of operation may be a small signal mode and second mode of operation may be a large signal mode. In other embodiments, input audio amplifier stage 105A may include other amplifier circuit arrangements operable to adjust the transconductance in response to amplifier switching circuit 114.

As illustrated, the audio input signal 102 may comprise a differential pair of audio input signals, and the input audio amplifier stage 105A is configured to receive the differential pair of audio input signals at plus (+) and minus (−) input terminals and process (e.g., such as amplify) the differential pair audio input signal as it travels through audio amplifier circuit 105A. By selectively switching the circuitry 106, high fidelity stable audio amplifier 100 provides for a variable input transconductance that is capable of being modified based on a signal mode (e.g., large signal mode or small signal mode) of operation of audio amplifier circuit 105. It will be understood that audio amplifier circuit 105 may receive various types of input signals, such as single ended input signals, differential current source signals, and/or differential voltage source signals and may process such signals in a manner similar to that described herein with regard to differential audio input signals 102.

Amplitude detection circuit 112 may be coupled to input audio amplifier stage 105A input terminals + and − to receive differential pair of audio input signal 102 at first input terminals of amplitude detection circuit 112. Amplitude detection circuit 112 also receives a signal mode threshold value 118 at a second input terminal. In some embodiments, amplitude detection circuit 112 is implemented as a comparator to compare an amplitude level of input signal 102 with signal mode threshold value 118 to provide an amplitude detection output signal 122. Amplitude detection output signal 122 provides a binary high state and a binary low state to amplifier switching circuit 114 and load switching circuit 116.

In some embodiments, signal mode threshold value 118 is implemented as a small signal mode threshold value and a large signal mode threshold value. In some embodiments, a large signal mode threshold may be adjusted to minus fifty five dB and a small signal mode threshold may be adjusted to minus one hundred dB. In this regard, an amplitude level of input signal 102 of approximately minus one hundred dB is detected as a small signal mode signal and amplitude detection circuit 112 provides a binary low state (e.g., a small signal mode detection signal). Alternatively, an amplitude level of input signal 102 of approximately minus fifty five dB is detected as a large signal mode signal and amplitude detection circuit 112 provides a binary high state (e.g., a large signal mode detection signal). It will be appreciated that signal mode threshold value 118 may be set to other values in other embodiments. In some embodiments, amplitude detection circuit 112 includes a time delay circuit 112A that is configured to add a delay to amplitude detection output signal 122 for a period of time if the amplitude level of input signal 102 is less than or equal to signal mode threshold value 118. In some embodiments, time delay circuit 112A is implemented as a counter. In various embodiments, the time delay is approximately one hundred milliseconds, but other time delays are possible in other embodiments, such as between 50 and 100 milliseconds, for example.

Amplifier switching circuit 114 is coupled to the amplitude detection output signal 122 and is configured to adaptively adjust input transconductance of input audio amplifier stage 105A based on the amplitude detection output signal 122. In this regard, amplifier switching circuit 114 may increase an input transconductance within input audio amplifier stage 105A if amplitude level of input signal 102 is detected as a small signal mode input signal. In some embodiments, amplifier switching circuit 114 is adjusted to reduce an input transconductance of input audio amplifier stage 105A if amplitude level of input signal 102 is detected as a large signal mode signal. In this regard, high fidelity stable audio amplifier 100 provides for a variable input transconductance that is capable of being adjusted based on a signal mode (e.g., large signal mode or small signal mode) operation of audio amplifier circuit 105.

Load switching circuit 116 is coupled to the amplitude detection output signal 122 and is configured to adaptively adjust stability resistor 110, which is coupled to the audio amplifier circuit 105 output. For example, load switching circuit 116 is configured to decouple stability resistor 110 from the output of audio amplifier circuit 105 if amplitude level of input signal 102 is detected as a large signal mode signal. Stability resistor 110 is decoupled from the output of audio amplifier circuit 105 by opening switches 116A and 116B. Switch 116A includes a wiper end connected to a first end of stability resistor 110 and a terminal end coupled to a positive output terminal of audio amplifier circuit 105 and a first end of complex impedance speaker load 135. Switch 116B includes a wiper end connected to a second end of stability resistor 110 and a terminal end coupled to a negative output terminal of audio amplifier circuit 105 and a second end of complex impedance speaker load 135. In this regard, stability resistor 110 is decoupled when amplitude level of input signal 102 is a large signal mode signal to reduce a current through stability resistor 110, and lower power consumption and thermal dissipation of high fidelity stable audio amplifier 100.

Moreover, load switching circuit 116 is configured to couple stability resistor 110 to audio amplifier circuit 105 if the amplitude level of input signal 102 is detected as a small signal mode signal. In this regard, stability resistor 110 may be coupled during a time when amplitude level of input signal 102 is a small signal mode signal to maintain stability of high fidelity stable audio amplifier 100 without a significant increase in power consumption. Significantly, time delay circuit 112A is configured to add a time delay to ensure that amplitude level of input signal 102 remains a small signal mode signal to avoid unwanted high current consumption. In some embodiments, stability resistor 110 is a one hundred ohm stability resistor 110. However, stability resistor 110 may be other values in other embodiments.

Figure 2A:
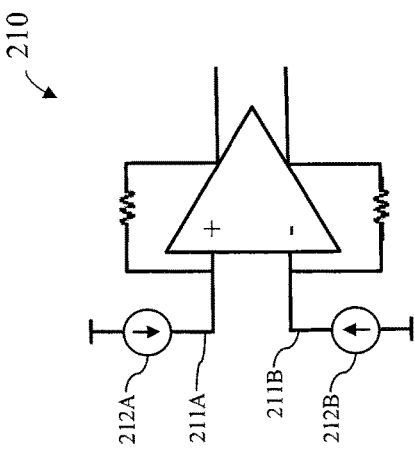
FIGS. 2A-C illustrate exemplary schematic diagrams of input audio amplifier circuits in accordance with embodiments of the disclosure.
Figure 2B:
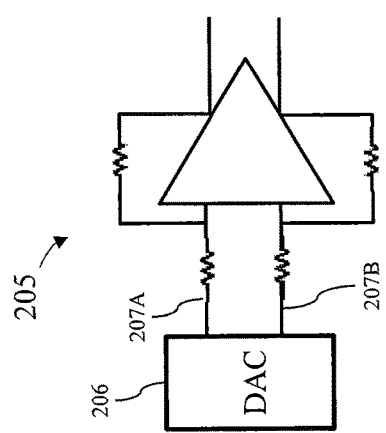
Figure 2C:
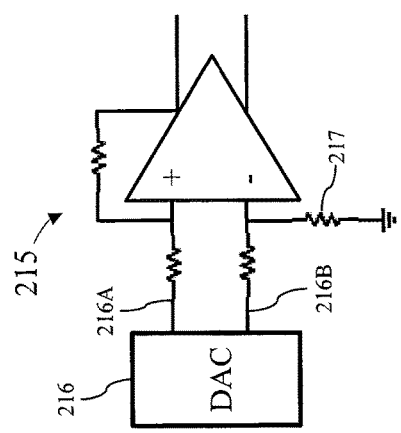

FIGS. 2A-C illustrate exemplary schematic diagrams of various input audio amplifier circuits in accordance with embodiments of the disclosure. In this regard, as shown in FIG. 2A, input audio amplifier circuit may be implemented as a differential voltage input audio amplifier circuit 205. Digital-to-analog converter (DAC) 206 provides differential voltage signals 207A and 207B at non-inverting (+) and inverting (−) input terminals, respectively. In this embodiment, input audio amplifier circuit 205 is configured as a difference amplifier to process the differential output voltage from DAC 206.

FIG. 2B illustrates that input audio amplifier circuit 210 may be configured to receive differential current signals 211A and 211B from current sources 212A and 212B at non-inverting (+) and inverting (−) input terminals, respectively. In this embodiment, input audio amplifier circuit 210 is configured as a difference amplifier to process the differential current signals 211A and 211B. FIG. 2C illustrates input audio amplifier may be implemented as a single ended audio amplifier circuit 215. DAC 216 provides a voltage signal 216A at non-inverting (+) terminal. A voltage signal 216B at inverting (−) input terminal is connected to ground through resistor 217. In this embodiment, input audio amplifier circuit 215 is configured as a single ended amplifier to process the single ended output voltage signals 216A and 216B from DAC 216.

Figures 3A, 3B:
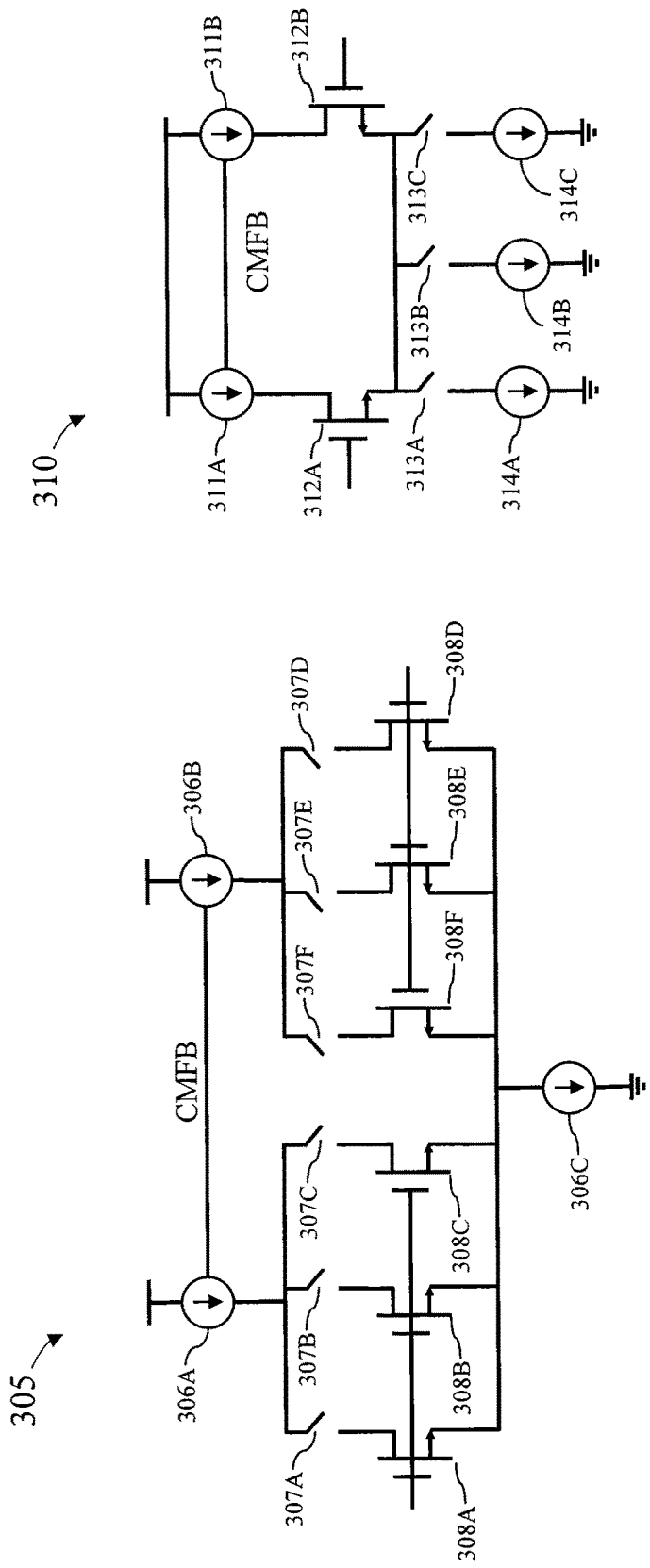
FIGS. 3A-B illustrate exemplary schematic diagrams of programmable input transconductance circuits in accordance with embodiments of the disclosure.

FIGS. 3A-B illustrate exemplary schematic diagrams of programmable input transconductance circuits in accordance with embodiments of the disclosure. As shown in FIG. 3A, programmable input transconductance circuit 305 may be implemented with current sources 306A-C. In this regard, current source 306A may be switched using switches 307A-C and a programmable input transconductance may be controlled by transistors 308A-C. A mirror programmable input transconductance circuit 305 may be implemented using current source 306B controlled by switches 307D-F and transistors 308D-F. FIG. 3B illustrates an alternate programmable input transconductance circuit 310. In this regard, current source 311A is controlled by transistor 312A and switches 313A-C connect to current sources 314A-C, respectively. Programmable input transconductance circuit 310 also includes a current source 311B, transistor 312B, and switches 313A-C to control programmability of input transconductance. In this regard, in some embodiments, programmable input transconductance circuits 305 and 310 may vary in current and physical size to control input transconductance within input audio amplifier stage 105A of audio amplifier circuit 105.

Figure 4:
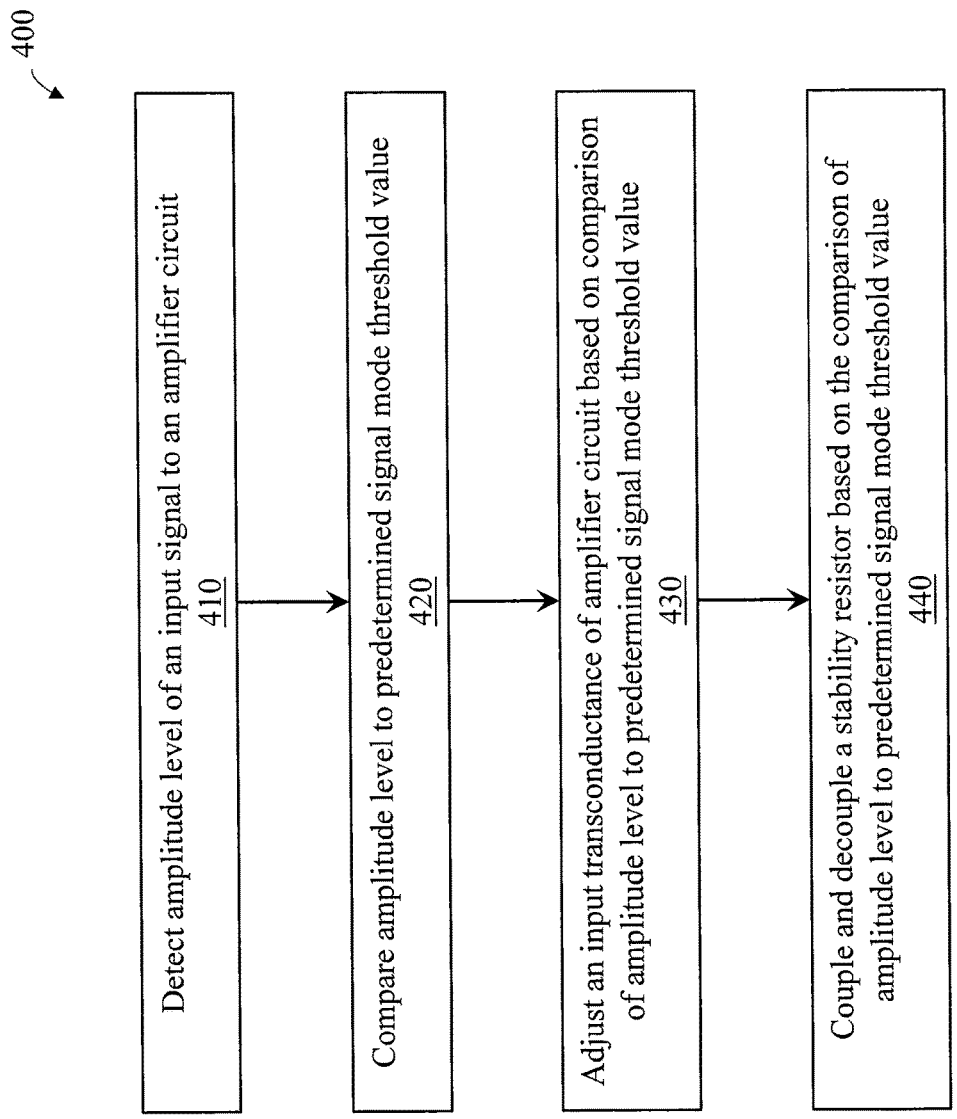
FIG. 4 is a flow chart illustrating a method for high fidelity stable audio amplification in accordance with an embodiment of the disclosure.

FIG. 4 is a flow chart illustrating a method 400 for high fidelity stable audio amplification in accordance with an embodiment of the disclosure. Method 400 includes operations for detecting an amplitude level of an input signal 102 (step 410) and comparing the amplitude level to a signal mode threshold value 118 for a large signal mode signal and a small signal mode signal (step 420). Operations of steps 410 and 420 may be performed, for example, by an amplitude detection circuit 112. Method 400 may further include operations (step 430) of adjusting an input transconductance of the input audio amplifier stage 105A of audio amplifier circuit 105 to adjust an input transconductance of audio amplifier circuit 105 based on comparing the amplitude level of input signal 102 to the large signal mode and small signal mode threshold values 118. Method 400 may further include operations (step 440) of coupling a stability resistor 110 based on the comparison to maintain amplifier stability, and reduce a power consumption and thermal dissipation in high fidelity stable audio amplifier 100.

Where applicable, various embodiments provided by the present disclosure may be implemented using hardware, software, or combinations of hardware and software. Also, where applicable, the various hardware components and/or software components set forth herein may be combined into composite components comprising software, hardware, and/or both without departing from the spirit of the present disclosure. Where applicable, the various hardware components and/or software components set forth herein may be separated into sub-components comprising software, hardware, or both without departing from the scope of the present disclosure. In addition, where applicable, it is contemplated that software components may be implemented as hardware components and vice-versa.

Software, in accordance with the present disclosure, such as program code and/or data, may be stored on one or more computer readable mediums. It is also contemplated that software identified herein may be implemented using one or more general purpose or specific purpose computers and/or computer systems, networked and/or otherwise. Where applicable, the ordering of various steps described herein may be changed, combined into composite steps, and/or separated into sub-steps to provide features described herein.

The foregoing disclosure is not intended to limit the present disclosure to the precise forms or particular fields of use disclosed. As such, it is contemplated that various alternate embodiments and/or modifications to the present disclosure, whether explicitly described or implied herein, are possible in light of the disclosure. Having thus described embodiments of the present disclosure, persons of ordinary skill in the art will recognize that changes may be made in form and detail without departing from the scope of the present disclosure. Thus, the present disclosure is limited only by the claims.

What is claimed is:

1. A method comprising:
    receiving an audio input signal at an input of an audio amplifier circuit comprising a plurality of amplifier stages and a stability resistor selectively coupled to an output of the plurality of amplifier stages, wherein at least one of the plurality of amplifier stages has a variable input transconductance, the audio amplifier circuit having at least two modes of operation comprising:
        a first mode of operation wherein the at least one of the plurality of amplifier stages is set to a first input transconductance and wherein the stability resistor is coupled to the output of the plurality of amplifier stages; and
        a second mode of operation wherein the at least one of the plurality of amplifier stages is set to a second input transconductance that is lower than the first input transconductance and wherein the stability resistor is decoupled from the output of the plurality of amplifier stages;

detecting an amplitude level associated with the audio input signal;

determining one of the at least two modes of operation corresponding to the amplitude level; and adaptively adjusting the input transconductance of the at least one of the amplifier stages and selectively coupling the stability resistor based on the determined one of the at least two mode of operation.

2. The method of claim 1, wherein the first mode of operation comprises a small signal mode and the second mode of operation comprises a large signal mode.

3. The method of claim 2, wherein determining one of the at least two modes of operation further comprises selecting a signal mode threshold value comprising one of a small signal mode threshold value and a large signal mode threshold value.

4. The method of claim 3, wherein determining one of the at least two modes of operation further comprises:
    comparing the audio input signal to the signal mode threshold value; and
    providing a signal mode detection signal based on the comparing, wherein the signal mode detection signal comprises one of a small signal mode detection signal and a large signal mode detection signal.

5. The method of claim 4, wherein the providing comprises confirming the small signal mode detection signal across a period of time.

6. The method of claim 5, wherein the period of time is approximately one hundred milliseconds.

7. The method of claim 2, wherein the stability resistor comprises a one hundred ohm stability resistor, and wherein adaptively adjusting comprises coupling the one hundred ohm stability resistor at the output of the plurality of amplifier stages for the small signal mode, and decoupling the one hundred ohm stability resistor from the output of the plurality of amplifier stages for the large signal mode.

8. The method of claim 1, wherein the plurality of amplifier stages comprises three amplifier stages comprising a first amplifier stage receiving the audio input signal, and wherein the adaptively adjusting comprises adjusting a variable input transconductance for the first amplifier stage.

9. The method of claim 1, wherein the audio amplifier circuit comprises a headphone amplifier.

10. The method of claim 1, further comprising a speaker coupled to the output of the audio amplifier circuit and configured to receive an amplified audio signal associated with the audio input signal.

11. A system comprising:
    an audio amplifier circuit comprising a plurality of amplifier stages and a stability resistor selectively coupled to an output of the plurality of amplifier stages, wherein at least one of the plurality of amplifier stages has a variable input transconductance, and wherein the audio amplifier circuit is operable to receive and amplify an audio input signal in accordance with at least two modes of operation comprising:
        a first mode of operation having a first input transconductance in the at least one of the plurality of amplifier stages and wherein the stability resistor is coupled to the output of the amplifier stages; and
        a second mode of operation having a second input transconductance in the at least one of the plurality of amplifier stages, wherein the second input transconductance is lower than the first input transconductance and the stability resistor is decoupled from the output of the plurality of audio amplifier stages;
    an amplitude detection circuit coupled to the audio amplifier circuit and operable to receive the audio input signal and compare the audio input signal to a signal mode threshold to provide a signal mode detection signal;
    an amplifier switching circuit coupled to the amplitude detection circuit and operable to receive the signal mode detection signal and adjust the variable input transconductance of the at least one of the plurality of amplifier stages; and
    a load switching circuit coupled to the amplitude detection circuit and operable to selectively couple and selectively decouple the stability resistor at the output of the plurality of amplifier stages.

12. The system of claim 11, wherein the first mode of operation comprises a small signal mode and the second mode of operation comprises a large signal mode.

13. The system of claim 12, wherein amplitude detection circuit is further operable to select a signal mode threshold value comprising one of a small signal mode threshold value and a large signal mode threshold value.

14. The system of claim 12, wherein the stability resistor comprises a one hundred ohm stability resistor and wherein the load switching circuit is operable to couple the one hundred ohm stability resistor at the output of the plurality of amplifier stages for the small signal mode, and decouple the one hundred ohm stability resistor from the output of the plurality of amplifier stages for the large signal mode.

15. The system of claim 11, wherein the amplitude detection circuit further comprises a comparator operable to compare the audio input signal to the signal mode threshold; and provide a signal mode detection signal based on an output of the comparator, wherein the signal mode detection signal comprises one of a small signal mode detection signal and a large signal mode detection signal.

16. The system of claim 15, wherein the amplitude detection circuit further comprises a delay circuit operable to delay providing the small signal mode detection signal for a delay period, and wherein the small signal mode detection signal is provided if the signal mode detection signal remains unchanged during the delay period.

17. The system of claim 16, wherein the delay period is approximately one hundred milliseconds.

18. The system of claim 11, wherein the plurality of amplifier stages comprises three amplifier stages, and wherein the amplifier switching circuit is operable to adjust a variable input transconductance of a first amplifier stage to provide a higher input transconductance for the first mode and a lower input transconductance for the second mode.

19. The system of claim 11, wherein the audio amplifier circuit comprises a headphone amplifier.

20. The system of claim 11, further comprising a speaker coupled to the output of the audio amplifier circuit and operable to receive an amplified audio signal associated with the audio input signal.

* * * * *